United States Patent
Liu (10) Patent No.: US 10,297,640 B2
(45) Date of Patent: May 21, 2019

(54) CROSS-POINT MEMORY WITH SELF-DEFINED MEMORY ELEMENTS

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 12/955,494

(22) Filed: Nov. 29, 2010

(65) Prior Publication Data

US 2012/0132881 A1 May 31, 2012

(51) Int. Cl.
*H01L 27/10* (2006.01)
*H01L 27/24* (2006.01)
*H01L 45/00* (2006.01)

(52) U.S. Cl.
CPC ........ *H01L 27/2463* (2013.01); *H01L 27/101* (2013.01); *H01L 27/249* (2013.01); *H01L 45/141* (2013.01); *H01L 45/145* (2013.01)

(58) Field of Classification Search
CPC .... H01L 27/2481; H01L 45/04; H01L 27/249
USPC .......................................................... 257/4
See application file for complete search history.

(56) References Cited

U.S. PATENT DOCUMENTS

| | | | |
|---|---|---|---|
| 7,399,691 B2 | 7/2008 | Lieber et al. | |
| 7,511,998 B2 | 3/2009 | Lee et al. | |
| 2004/0223390 A1* | 11/2004 | Campbell | H01L 45/085 365/202 |
| 2007/0132049 A1* | 6/2007 | Stipe | 257/421 |
| 2008/0278989 A1* | 11/2008 | Lee et al. | 365/148 |
| 2009/0095985 A1* | 4/2009 | Lee | G11C 13/0007 257/211 |
| 2009/0200536 A1 | 8/2009 | Van Schaijk et al. | |
| 2009/0213643 A1 | 8/2009 | Angerbauer et al. | |
| 2009/0230512 A1* | 9/2009 | Baek | H01L 27/249 257/536 |
| 2010/0202186 A1* | 8/2010 | Sato et al. | 365/148 |
| 2011/0032753 A1* | 2/2011 | An et al. | 365/163 |

* cited by examiner

*Primary Examiner* — Lex H Malsawma
*Assistant Examiner* — Geoffrey H Ida
(74) *Attorney, Agent, or Firm* — Schwegman Lundberg & Woessner, P.A.

(57) ABSTRACT

Some embodiments include a memory device having first structures arranged in a first direction and second structures arranged in a second direction. At least one structure among the first and second structures includes a semiconductor material. The second structures contact the first structures at contact locations. A region at each of the contact locations is configured as memory element to store information based on a resistance of the region. The structures can include nanowires. Other embodiments are described.

18 Claims, 5 Drawing Sheets

CROSS-POINT MEMORY WITH SELF-DEFINED MEMORY ELEMENTS

BACKGROUND

Computers and other electronic products, e.g., digital televisions, digital cameras, and cellular phones, often have a memory device to store information. Some conventional memory devices may store information based on the amount of charges on a storage node of a memory cell. Other conventional memory device may store information based on a resistance state of a memory element of the memory cell. As the size of each memory cell gets smaller to accommodate some applications, producing memory devices with smaller cell size may pose challenges.

DETAILED DESCRIPTION

Figure 1:
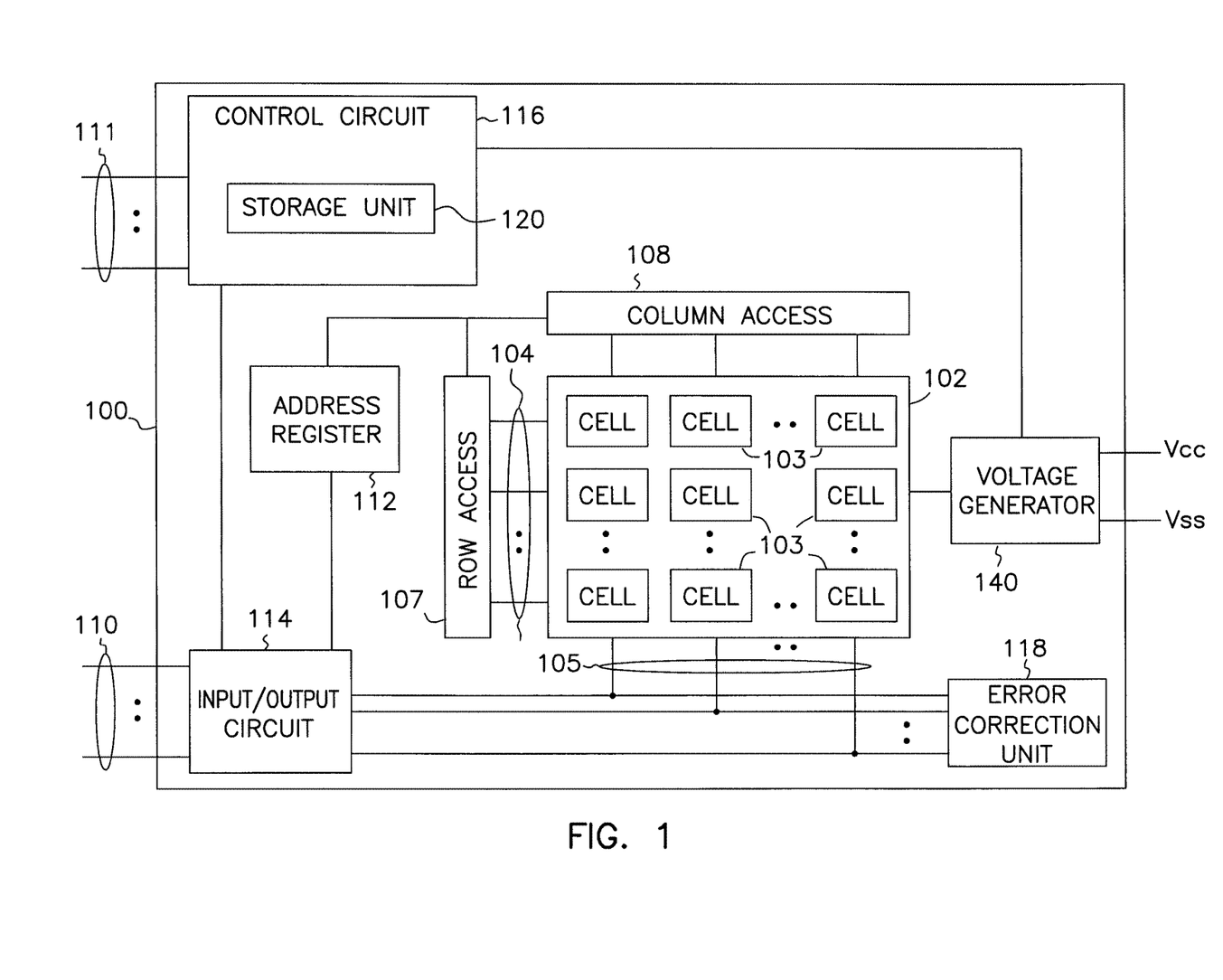
FIG. 1 shows a block diagram of a memory device, according to an embodiment of the invention.

FIG. 1 shows a block diagram of a memory device 100 according to an embodiment of the invention. Memory device 100 includes a memory array 102 with memory cells 103 that may be arranged in rows and columns along with access lines 104 and data lines 105. Memory device 100 can use access lines 104 to access memory cells 103 and data lines 105 to transfer information with memory cells 103. Row access 107 and column access circuitry 108 respond to an address register 112 to access memory cells 103 based on row address and column address signals on terminals 110, 111, or both. A data input/output circuit 114 transfers data between memory cells 103 and terminals 110. Terminals 110 and 111 may be external terminals of memory device 100 (e.g., terminals exposed outside a chip or semiconductor package that contains memory device 100).

A control circuit 116 controls operations of memory device 100 based on signals present on terminals 110 and 111. A device (e.g., a processor or a memory controller) external to memory device 100 may send different commands (e.g., write commands and read commands) to memory device 100 using different combinations of signals on terminals 110, 111, or both.

Memory device 100 responds to commands to perform operations such as write (e.g., programming), read, and erase operations. A write operation may store information received at terminals 110 into memory cells 103 (e.g., transfer information from terminals 110 to memory cells 103). A read operation retrieves stored information from memory cells 103 (e.g., transfer information from memory cells 103 to terminals 110). An erase operation erases information (e.g., clears information) from all memory cells 103 or from a selected portion of memory cells 103.

Memory device 100 receives supply voltages Vcc and Vss. Vcc may include a positive voltage value, and Vss may include a ground potential. Memory device 100 can also include a voltage generator 140. Voltage generator 140 and control circuit 116 operate to provide different voltages to memory array 102 or to cause memory array 102 to receive different voltages during the operations (e.g., write and read operations) of memory device 100.

Memory device 100 may include an error correction unit 118 to check for errors in information retrieved from memory cells 103. Error correction unit 118 may include error correction circuitry to correct errors based on an error correction code (ECC), as is well-known to those of ordinary skill in the art.

Memory device 100 may include a storage unit 120, which may include circuit components such as registers. Storage unit 120 may include a hardware portion, a firmware portion, or both, of memory device 100. Storage unit 120 may also be used to store codes (e.g., software programming instructions).

Memory device 100 can be a flash memory device such as a NAND flash or a NOR flash memory device, a resistive random access memory (RRAM) device, a phase change memory device, and other kinds of memory devices.

Memory device 100 can be a single-level-cell memory device such that memory cells 103 can include memory element to store information to represent a value of a single bit of information. For example, memory cells 103 may store information that represents either a binary "0" value or a binary "1" value of a single bit of information.

Memory device 100 can be a multi-level-cell (MLC) memory device such that each of memory cells 103 can include memory element to store information represented by a value corresponding to multiple bits of information (e.g., a value corresponding to two, three, four, or some other number of bits of information). For example, when each of memory cells 103 corresponds to a 2-bit per cell, each of memory cells 103 may store information to represent a value corresponding to one of four possible combinations of two binary bits of information (i.e., combination 00, 01, 10, and 11 corresponding to two bits of information).

Single level and MLC memory devices may be combined within memory device 100. One of ordinary skill in the art will readily recognize that memory device 100 can include other parts, which are omitted from FIG. 1 to help focus on the various embodiments described herein. Memory device 100 may include one or more of the embodiments described below with reference to FIG. 2 through FIG. 7.

Figure 2:
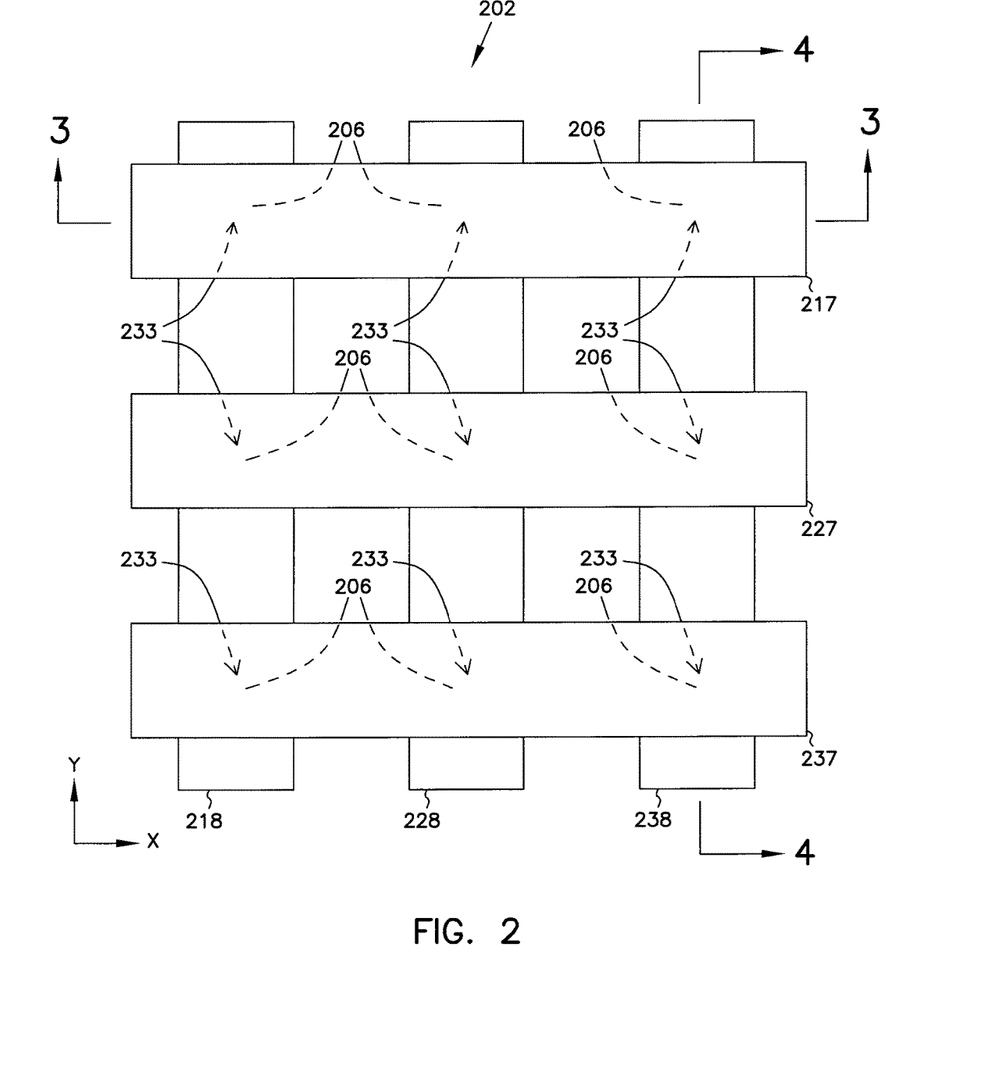
FIG. 2 shows a top view of a memory array, according to an embodiment of the invention.
Figure 3:
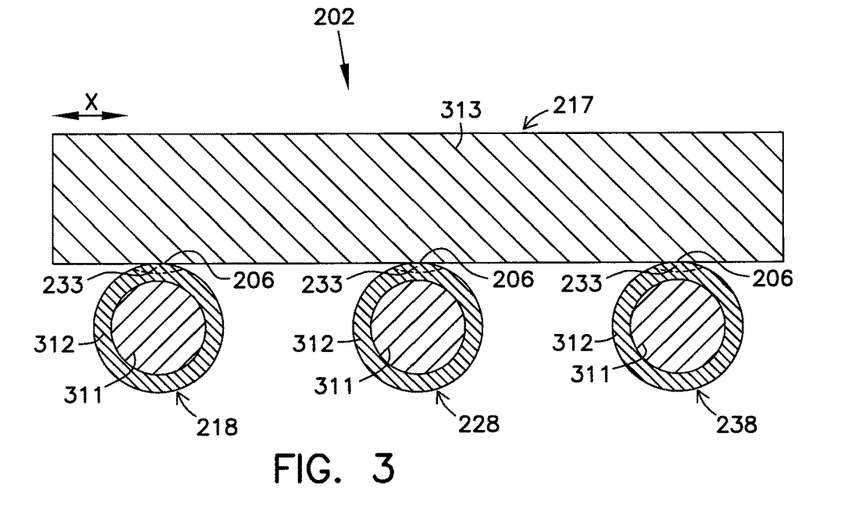
FIG. 3 shows a cross-section of a side view of the memory array of FIG. 2, according to an embodiment of the invention.
Figure 4:
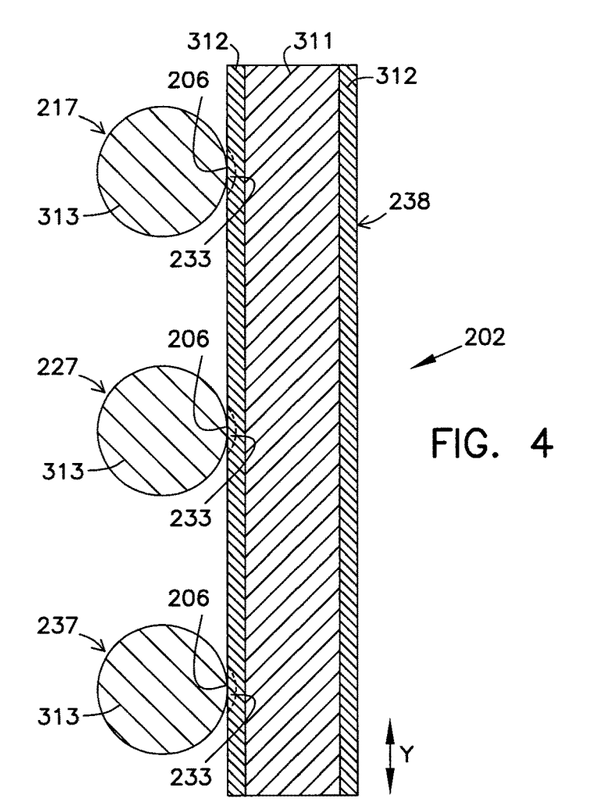
FIG. 4 shows a cross-section of another side view of the memory array of FIG. 2, according to an embodiment of the invention.

FIG. 2 shows a top view of a memory array 202, according to an embodiment of the invention. Memory array 202 in FIG. 2 can be included in a memory device, such as memory device 100 of FIG. 1. Two different cross-sections of two side views of memory array 202 in FIG. 2 along line 3-3 and line 4-4 are shown in FIG. 3 and FIG. 4, respectively, which are described in detail following the description of FIG. 2.

As shown in FIG. 2, memory array 202 includes structures 217, 227, and 237 arranged with structures 218, 228, and 238 in a crossing pattern. Structures 217, 227, and 237 are arranged in an X-direction. Structures 218, 228, and 238 are arranged in a Y-direction and underneath structures 217, 227, and 237. The X-direction and Y-direction are perpendicular to each other. Structures 217, 227, 237, 218, 228, and 238 can include nanowires, in which the diameter in each nanowire can be in nanometer range. For example, the diameter can be in a range of 5 nanometers to 100 nanometers. Other ranges can be used.

The arrangements of the structures of memory array 202 can be exchanged. For example, structures 217, 227, and 237 can be arranged in the Y-direction, and structures 218, 228, and 238 can be arranged in the X-direction. FIG. 2 shows structures 217, 227, and 237 overlying structures 218, 228, and 238, as an example. The position of the structures can also be exchanged. For example, structures 217, 227, and 237 can be underneath structures 218, 228, and 238.

As shown in FIG. 2, structures 217, 227, and 237 contact (directly touch) structures 218, 228, and 238 at contact locations (cross points) 206. Each of structures 218, 228, and 238 includes a region 233 at each contact location 206.

Each region 233 can be configured to operate as a memory element of a memory cell to store a single bit of information or multiple bits of information. The value of the stored information can correspond to the value of the resistance of the material in a region 233. The number of memory cells in memory array 202 can be equal to the number of regions 233. The number of regions 233 depends on the number of structures in memory array 202. FIG. 2 shows memory array 202 having three structures 217, 227, and 237 and three structures 218, 228, and 238 as an example, the number of structures can vary.

FIG. 3 shows a cross-section of a side view of memory array 202 along line 3-3 of FIG. 2, according to an embodiment of the invention. As shown in FIG. 3, contact locations 206 are locations where structure 217 (extending in the X-direction, across the figure) contacts each of structures 218, 228, and 238 (extending in the Y-direction into the figure). Each of structures 218, 228, and 238 can include a material 311 and a material 312. As shown in FIG. 3, material 312 completely coats the circumference of material 311 such that the cross-section of material 311 is completely surrounded by material 312. Structure 217 can include only a single material 313, which contacts material 312 of each of structures 218, 228, and 238 at a corresponding contact location 206.

FIG. 4 shows a cross-section of another side view of memory array 202 along line 4-4 of FIG. 2, according to an embodiment of the invention. As shown in FIG. 4, contact locations 206 are locations where material 312 of structure 238 (extending in the Y-direction, up and down the figure) contacts material 313 of each of structures 217, 227, and 237 (extending in the X-direction into the figure). As also shown in FIG. 4, material 312 completely coats the circumference of material 311 along the entire length of structure 238 in the Y-direction.

FIG. 3 and FIG. 4 show each region 233 being defined by a broken line in a portion of material 312 to indicate that each region 233 can be included in material 312 and may occupy only a portion of material 312. Thus, regions 233 can have the same material as material 312. As mentioned above, each region 233, such as the region defined by the broken line in material 312 in FIG. 3 and FIG. 4, can be configured to operate as a memory element.

The value of the resistance of the material at a particular region 233 can be changed to represent different values of information to be stored at that particular region. For example, appropriate voltages can be applied to structures 217, 227, and 237 and structures 218, 228, and 238 during a write operation of a memory device to selectively change the properties of the material (e.g., material 312) of a particular region 233, thereby changing the resistance value of the material at that particular region 233.

The value of the resistance at a particular region 233 can be determined (e.g., measured) to obtain the corresponding value of information stored in that particular region 233. For example, appropriate voltages can be applied to structures 217, 227, and 237 and structures 218, 228, and 238 during a read operation of a memory device to selectively measure the value of current (or voltage) associated with a particular region 233. The value of the measured current (or voltage) can be translated into the value of information stored in that particular region 233.

The memory elements associated with regions 233 of material 312 can be considered as self-defined memory elements. As shown in FIG. 3 and FIG. 4, regions 233 in material 312 are formed at the same time (e.g., the same processing step) that material 312 is formed, e.g., by processes known to those skilled in the art. Thus, besides material 312, no additional material or a separate processing step may be needed to form regions 233 because regions are parts of material 312. Therefore, regions 233 can be considered as self-defined regions at contact locations 206 when structures 217, 227, and 237 are arranged with structures 218, 228, and 238. Since regions 233 can be configured to operate as memory elements to store information, and regions 233 can be considered as self-defined regions, the memory elements associated with regions 233 can also be considered as self-defined memory elements.

Some conventional memory devices may have additional materials and separate processing steps to form memory elements. Thus, in comparison with some conventional memory devices, memory array 202 may include fewer processing steps to form memory elements of memory array 202. Since regions 233 can be configured to operate as memory elements to store information, regions 233 can also be considered as active regions of the memory cells of memory array 202. The active regions corresponding to regions 233 of memory array 202 can also be considered as self-defined active regions. Further, since conventional memory devices may have additional materials and separate processing steps to form memory elements, misalignment issue involving memory elements may occur during forming these conventional memory devices. In memory array 202, since memory elements associated with regions 233 of material 312 can be considered as self-defined memory elements, such that the memory elements can be self-aligned at corresponding contact locations 206 when structures 217, 227, and 237 are arranged with structures 218, 228, and 238. Thus, misalignment issue may be avoided in memory array 202.

Both materials 311 and 313 can include semiconductor materials of different conductivity types, such as n-type and p-type semiconductor materials. As an example, material 311 can include p-type semiconductor material and material 313 can include n-type semiconductor material. In another example, material 311 can include n-type semiconductor material and material 313 can include p-type semiconductor material. One or both of the p-type and n-type semiconductor materials can be heavily doped semiconductor material to improve conductivity.

One of materials 311 and 313 can include a semiconductor material and the other one can include a metal material, such that a Schottky diode behavior can be present between the structures for memory operation. For example, material 311 can include a semiconductor material and material 313 can include metal. In another example, material 313 can include a semiconductor material and material 311 can include metal.

Material 312 can include a variable resistance material. As used herein, the term "variable resistance material" includes materials that are capable of exhibiting more than one value of electrical resistivity, and hence, conductivity. Examples of variable resistance materials include phase change materials, colossal magnet resistive films (e.g., $Pr_{1-x}Ca_xMnO_3$ (PCMO), $La_{1-x}Ca_xMnO_3$ (LCMO), and $Ba_{1-x}Sr_xTiO_3$), and metal oxide materials.

Phase change materials may include chalcogenide materials with various combinations of germanium (Ge), antimony (Sb), Tellurium (Te), and other similar materials. Some examples phase change materials include of GeTe, In—Se, Sb—Te, Ge—Sb, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt.

The memory cells included in memory array 202 can be individually selected. Thus, the memory device that includes memory array 202 can be included in an RRAM device because the memory cell in memory array 202 can store information based on the resistance value of material 312. As shown in FIG. 3 and FIG. 4, unlike some conventional memory devices, a separate diode or a separate rectifying component can be omitted from each memory cell of memory array 202 because rectifying behavior is inherent (e.g., built-in) in memory array 202. To implement memory array 202 with the inherent rectifying behavior, material 312 may include memory switching materials of only a unipolar type because current can only flow in one direction in this type of RRAM device. Examples of unipolar memory switching memory materials include NiO, $Cu_2O$, HfO, $TiO_2$, $ZrO_2$, $Ta_2O_5$, ZnO, $WO_3$, $Nb_2O_3$, and $GdO_2$.

FIG. 3 and FIG. 4 show material 312 completely coating material 311, as an example. In some cases, material 312 may coat only a portion (partially coats) of material 311, leaving a portion of material 311 uncovered by material 312. For example, in FIG. 3, material 312 may coat only a portion of material 311 near contact location 206, leaving the rest of material 311 uncovered by material 312.

In alternative cases, material 311 can be uncoated and material 312 may coat only a portion of material 313 or the entire material 313 of structures 217, 227, and 237. For example, in FIG. 3, material 312 may coat material 313 of structures 217, 227, and 237 such that material 312, coating material 313, directly touches material 311 at contact locations 206. If material 312 includes a phase change material and both of materials 311 and 313 include semiconductor materials of different types (e.g., n-type and p-type), material 312 may coat only the structure that has the p-type semiconductor material. The reason is that phase change materials are generally p-type materials, which have a similar conductivity type as the p-type semiconductor material.

In some other alternative cases, if at least one of materials 311 and 313 includes a metal material, material 312 can include a phase change material coating the structure that has the metal material (e.g., material 311). However, the structure with the phase change material should be formed such that an ohmic contact is formed with the metal material to allow proper memory operation.

FIG. 3 and FIG. 4 show structures 217, 227, 237, 218, 228, and 238 having a circular shape as an example. In some cases, these structures can have other shapes, such as shapes that result from depositing, patterning, and/or etching processes during formation of these structures. For example, the shape can be square or rectangular (e.g., a long rectangular strip) with a square or rectangular cross-section instead of a circular cross-section. The circular shape of structures 218, 228, and 238 (FIG. 3 and FIG. 5) and structures 217, 227, and 237 (FIG. 4 and FIG. 6) may provide a relatively smaller active region (such as region 233) at each contact location, in comparison with other shapes, such as patterned (e.g., rectangular or square) shapes.

As described above with reference to FIG. 3 and FIG. 4, each of memory cells in memory array 202 can be formed without a separate diode or a separate rectifying component. Thus, the density of a memory device having memory array 202 can be higher than that of conventional memory devices having a diode, a rectifying component, or both, or other type of selection devices such as transistors, in each memory cell. Further, without a diode or a rectifying component in each memory cell along with the circular shape of the structures may allow an improvement in scaling a memory device that includes memory array 202.

Figure 5:
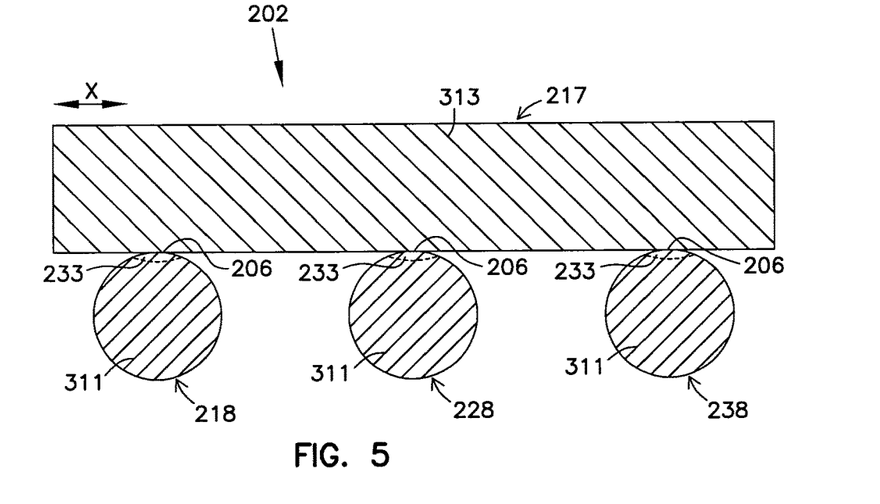
FIG. 5 shows a cross-section of a side view of an alternative structure of the memory array of FIG. 2, according to an embodiment of the invention.

FIG. 5 shows a cross-section of a side view of an alternative structure of memory array 202 of FIG. 2, according to an embodiment of the invention. In the alternative structure of memory array 202 in FIG. 5, each of structures 218, 228, and 238 includes only a single material, such as material 311. In comparison with the structure of memory array 202 in FIG. 3, structures 218, 228, and 238 in FIG. 5 have no material that coats material 311 (e.g., material 312 in FIG. 3). Thus, in FIG. 5, material 311 directly touches material 313 of structure 217 at contact locations 206. As shown in FIG. 5, region 233 is included in and occupies only a portion of material 311 at contact location 206. Thus, regions 233 can have the same material as material 311. The portion of material 311 defined by region 233 can be configured to operate as a memory element.

Figure 6:
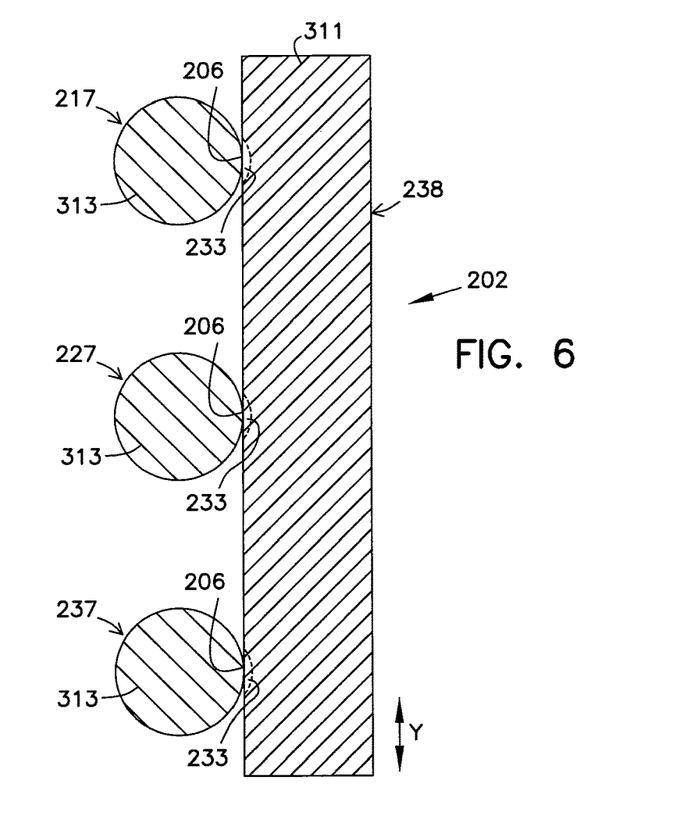
FIG. 6 shows a cross-section of another side view of an alternative structure of the memory array of FIG. 2, according to an embodiment of the invention.

FIG. 6 shows another cross-section of another side view of the alternative structure of memory array 202, according to an embodiment of the invention. The alternative structure of memory array 202 in FIG. 5 and FIG. 6 are the same. As shown in FIG. 6, contact locations 206 are locations where material 313 of each of structures 217, 227 and 237 directly touches material 311 of structure 238.

In the alternative structure of memory array 202 shown in FIG. 5 and FIG. 6, one of materials 311 and 313 can include a semiconductor material and the other one can include a phase change material. For example, material 311 can include a semiconductor material (e.g., n-type) and material 313 can include a phase change material. In other example, material 313 can include a semiconductor material (e.g., n-type) and material 311 can include a phase change material.

The circular shape of the structures in memory array 202 in FIG. 5 and FIG. 6 may also allow a relatively smaller amount of current during operation of memory array 202. As is known to those skilled in the art, electrical current may be used to change a state of a memory element having a phase change material. Thus, when region 233 is formed from a phase change material, a relatively smaller amount of current (e.g., reset current) may be used to reset region 233 (e.g., change its state). The smaller amount of reset current can be attributed to a relatively smaller size of region 233 that results from a smaller contact location 206 because of the circular shapes of structures 217, 227, 237, 218, 228, and 238.

Figure 7:
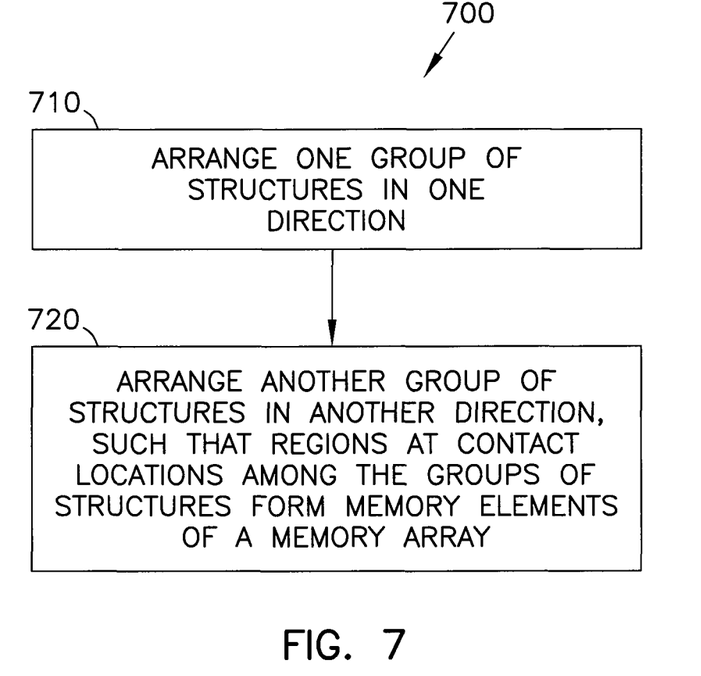
FIG. 7 shows a flow diagram for a method of forming a memory array, according to an embodiment of the invention.

FIG. 7 shows a flow diagram for a method 700 of forming a memory array, according to an embodiment of the invention. Method 700 can be used to form memory array 102 and memory array 202 described above with reference to FIG. 1 through FIG. 6. Method 700 of FIG. 7 can include activities 710 and 720. In activity 710, one group of structures can be arranged in one direction (e.g., an X-direction). In activity 720, another group of structures can be arranged in another direction (e.g., a Y-direction). The structures and materials of the structures in method 700 can include the materials and structures of structures 217, 227, 237, 218, 228, and 238, as described above with reference to FIG. 2 through FIG. 7. The regions at contact locations of the structures in method 700 can be configured to operate as memory elements of memory cells of the memory array, such as memory array 202 described above with reference to FIG. 2 through FIG. 6. Thus, the memory array formed by method 700 also includes memory cells with self-defined memory elements, such as the self-defined memory elements associated with regions 233 described above with reference to FIG. 2 through FIG. 6.

The illustrations of apparatus (e.g., memory device 100 of FIG. 1 and memory array 202 of FIG. 2 through FIG. 6) are intended to provide a general understanding of the structure of various embodiments and are not intended to provide a complete description of all the elements and features of apparatus or systems that might make use of the structures described herein.

The apparatus of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus may further be included as subcomponents within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others The embodiments described above with reference to FIG. 1 through FIG. 7 include a memory device having first structures arranged in a first direction and second structures arranged in a second direction. At least one structure among the first and second structures includes a semiconductor material. The second structures contact the first structures at contact locations. A region at each of the contact locations is configured as memory element to store information based on a resistance of the region. Other embodiments are described above with reference to FIG. 1 through FIG. 7.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:
1. A memory device comprising:
a first material continuously arranged in a first direction; and
second materials, each material of the second materials continuously arranged in a second direction, at least one material among the first material and the second materials including a semiconductor material, the second materials directly contacting the first material at contact locations at memory cell regions with respect to a top view of the first and second materials, the first material contacting the memory cell regions and spanning in the first direction continuously at locations between the memory cell regions, wherein for each of the first and the second materials, a first region including a portion of one of the first material and the second materials at each of the contact locations is configured to store information based on a resistance of the first region, and a second region including a portion of the second materials directly opposite from the first region is not configured to store information; and
a third material having a first side and a second side opposite from the first side and a third side connecting the first side to the second side, and at least one second material of the second materials completely coats the first, second, and third sides, wherein the at least one second material of the second materials completely coating the first, second, and third sides includes a same resistance material, the at least one second material of the second materials has a first side and a second side opposite from the first side, and the portion of the second materials directly opposite from the first region is included in the second side of the at least one second material of the second materials, and the entire second side of the at least one second material of the second materials is not configured to store information, wherein the first material includes a length spanning in the first direction continuously at locations between the memory cell regions with respect to the top view, and each of the second materials includes a length spanning in the second direction continuously at locations between the memory cell regions with respect to the top view, and wherein a direction from the first side of the at least one second material of the second materials to the second side of the at least one second material of the second materials is perpendicular to the length of each of the second materials.

2. The memory device of claim 1, wherein the semiconductor material is included in only the first material.

3. The memory device of claim 1, wherein each material of the second materials includes a variable resistance material and spans in the second direction continuously at locations between the memory cell regions in the second direction.

4. The memory device of claim 1, wherein the semiconductor material is included in the first material and has a first conductivity type, and the second materials have a second conductivity type.

5. The memory device of claim 4, wherein at least one of the first and second materials has a circular cross-section.

6. The memory device of claim 3, wherein the third material includes metal.

7. The memory device claim 1, wherein the semiconductor material is included in only the second materials.

8. The memory device of claim 1, wherein the semiconductor material is included in only the first material, and each material of the second materials includes a phase change material contacting the semiconductor material.

9. A memory device comprising:
a first semiconductor material continuously arranged in the a direction; and
second materials, each material of the second materials including a second semiconductor material continuously arranged in a second direction, and additional materials continuously arranged in the second direction, the second semiconductor material includes a first side and second side opposite from the second side and a third side connecting the first side to the second side, one of the additional materials completely coating the first, second, and third sides of the second semiconductor material of one of the second materials, the second materials crossing the first material at contact locations at memory cell regions with respect to a top view of the first and second materials, the top view being perpendicular to and a substrate of the memory device and the first and second directions, such that the additional materials directly contact the first semiconductor material at the contact locations, the first semiconductor material contacting the memory cell regions and spanning in the first direction continuously at locations between the memory cell regions, wherein for each of the first semiconductor material and the additional materials, a first region including a portion of the additional materials at each of the contact locations is configured to operate as a memory element of a memory cell of the memory device, and a second region including a portion of the additional materials directly opposite from the first region is not configured to store information, and a cross-section of the second semiconductor material of at least one of the second materials includes the first, second, and third sides, and the first, second, and third sides are surrounded by a respective additional material among the additional materials, wherein the respective additional material surrounding the first, second, and third sides of the at least one of the second materials includes a same resistance material, the respective additional material has a first side and a second side opposite from the first side, and the portion of the additional materials directly opposite from the first region is included in the second side of the respective additional material, and the entire second side of the respective additional material is not configured to store information, wherein the first material includes a length spanning in the first direction continuously at locations between the memory cell regions with respect to the top view, and each of the second materials includes a length spanning in the second direction continuously at locations between the memory cell regions with respect to the top view, and wherein a direction from the first side of the at least one second material of the second materials to the second side of the at least one second material of the second materials is perpendicular to the length of each of the second materials.

10. The memory device of claim 9, wherein each of the additional materials includes a phase change material.

11. The memory device of claim 9, wherein each of the additional materials includes a metal oxide material.

12. The memory device of claim 9, wherein each of the additional materials includes a uni-polar memory switching material.

13. The memory device of claim 9, wherein the first semiconductor material and the second semiconductor material have different conductivity types.

14. The memory device of claim 9, wherein each of the first and second materials has a diameter of in a range of 5 nanometers to 100 nanometers.

15. A method of forming a memory device, the method comprising:
arranging a first material in a first direction; and
arranging second materials in a second direction including arranging a each material of the second materials continuously in the second direction, at least one material among the first and second materials including a semiconductor material, wherein the first and second materials are arranged such that the second materials directly contact the first material at contact locations at memory cell regions with respect to a top view of the first and second materials and such that a memory element associated with each of the contact locations is included in the material of the second structures when the second materials are formed, the top view being perpendicular to a substrate of the memory device and the first and second directions, the first material contacting the memory cell regions and spanning in the first direction continuously at locations between the memory cell regions, wherein for each of the first and the second materials, a first region associated with the memory element is configured to store information, and a second region including a portion of the second materials directly opposite from the first region is not configured to store information; and
an additional semiconductor material having a first side and a second side opposite from the first side and a third side connecting the first side to the second side, and one of the second materials completely coats the first, second, and third sides, wherein the one of the second materials completely coating the first, second, and third sides of the additional semiconductor material includes a same resistance material, the one of the second materials has a first side and a second side opposite from the first side, and the portion of the second materials directly opposite from the first region is included in the second side of the one of the second materials, and the entire second side of the one of the second materials is not configured to store information, wherein the first material includes a length spanning in the first direction continuously at locations between the memory cell regions with respect to the top view, and each of the second materials includes a length spanning in the second direction continuously at locations between the memory cell regions with respect to the top view, and wherein a direction from the first side of the at least one second material of the second materials to the second side of the at least one second material of the second materials is perpendicular to the length of each of the second materials.

16. The method of claim 15, wherein the semiconductor material has a first conductivity type and is included in the first material, and the additional semiconductor material of a second conductivity type.

17. The method of claim 15, wherein each material of the second materials includes a variable resistance material.

18. The method of claim 15, wherein each material second materials includes a phase change material.

* * * * *